(12) United States Patent
Vosters et al.

(10) Patent No.: US 8,492,935 B2
(45) Date of Patent: *Jul. 23, 2013

(54) LITHOGRAPHIC APPARATUS HAVING A LORENTZ ACTUATOR WITH A COMPOSITE CARRIER

(75) Inventors: Petrus Mathijs Henricus Vosters, Bladel (NL); Martinus Arnoldus Henricus Terken, Lierop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/396,139

(22) Filed: Feb. 14, 2012

(65) Prior Publication Data

US 2012/0147354 A1    Jun. 14, 2012

Related U.S. Application Data

(63) Continuation of application No. 12/234,955, filed on Sep. 22, 2008, now Pat. No. 8,134,257.

(60) Provisional application No. 60/960,353, filed on Sep. 26, 2007.

(51) Int. Cl.
  *H02K 41/02*    (2006.01)
  *G03B 27/58*    (2006.01)
  *G03F 7/20*    (2006.01)

(52) U.S. Cl.
  CPC ........ *G03F 7/70758* (2013.01); *G03F 7/70716* (2013.01); *G03F 7/7095* (2013.01)
  USPC .................. 310/12.25; 310/12.05; 310/12.06; 310/12.33; 355/72

(58) Field of Classification Search
  CPC .. G03F 7/70716; G03F 7/70758; G03F 7/7095
  USPC ................ 355/53, 72, 75; 310/12.05, 12.06, 310/12.14, 12.24, 12.25, 12.33
  See application file for complete search history.

(56) References Cited

U.S. PATENT DOCUMENTS 6,054,784 A * 4/2000 Sperling et al. ............ 310/12.06
6,104,108 A    8/2000 Hazelton et al.
(Continued)

FOREIGN PATENT DOCUMENTS

JP    56-088666    7/1981
JP    01-160348    6/1989
(Continued)

OTHER PUBLICATIONS

Japanese Office Action dated Apr. 27, 2011 in corresponding Japanese Patent Application No. 2008-240101.

*Primary Examiner* — Steven H Whitesell Gordon
(74) *Attorney, Agent, or Firm* — Pillsbury Winthrop Shaw Pittman LLP

(57) ABSTRACT

An actuator is configured to produce a displacement force between a first and a second part to displace the first and second parts relative to each other. The Actuator includes a first magnet subassembly, attached to one of a first and a second part, and an electrically conductive element, attached to the other one of the first and second part and placed near the first magnet subassembly. The first magnet subassembly includes at least one set of at least two adjacently placed magnets oriented such that their magnetic polarizations are substantially mutually opposite, and a back mass made out of a magnetic flux guiding material and connecting the magnets to guide a magnetic flux there between. The first magnet subassembly includes a carrier made of a non-magnetic-flux-guiding material, the carrier including at least one recess in which the at least one set of back mass and magnets is embedded.

18 Claims, 9 Drawing Sheets

U.S. PATENT DOCUMENTS

| | | | |
|---|---|---|---|
| 6,184,972 B1 * | 2/2001 | Mizutani et al. | 355/72 |
| 6,208,408 B1 | 3/2001 | Takabayashi | |
| 6,483,574 B1 | 11/2002 | Zemel | |
| 6,717,296 B2 | 4/2004 | Hol et al. | |
| 6,906,789 B2 | 6/2005 | Carter et al. | |
| 8,134,257 B2 * | 3/2012 | Vosters et al. | 310/12.25 |
| 2003/0052548 A1 * | 3/2003 | Hol et al. | 310/12 |
| 2004/0075355 A1 | 4/2004 | Ries et al. | |
| 2004/0233412 A1 | 11/2004 | Ono et al. | |
| 2005/0083508 A1 * | 4/2005 | Hage | 355/72 |

FOREIGN PATENT DOCUMENTS

| | | |
|---|---|---|
| JP | 04-331452 | 11/1992 |
| JP | 09-308219 | 11/1997 |
| JP | 2000-109209 | 4/2000 |
| JP | 2001-262936 | 9/2001 |
| JP | 2003-158865 | 5/2003 |
| WO | 01/18944 | 3/2001 |

* cited by examiner

LITHOGRAPHIC APPARATUS HAVING A LORENTZ ACTUATOR WITH A COMPOSITE CARRIER

CROSS REFERENCE TO RELATED APPLICATIONS

This application is a continuation of U.S. patent application Ser. No. 12/234,955, filed Nov. 22, 2008, now allowed, which claims priority to U.S. Provisional Application Ser. No. 60/960,353, filed on Sep. 26, 2007, titled "Lithographic Apparatus Having a Lorentz Actuator With a Composite Carrier." The content of each of the foregoing applications is herein incorporated in their entirety by reference.

FIELD

The present invention relates to a lithographic apparatus having a Lorentz actuator and to a Lorentz actuator in general.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus of the type described above employs a plurality of actuators for positioning a part of the apparatus. Such actuators are applied for positioning a substrate table, a part of an irradiation system, a part of an illumination system or any other part of the lithographic apparatus. With this, a highly accurate relative positioning is desired, which is generally accomplished with the aid of a Lorentz actuator.

A Lorentz actuator includes an electrically conductive element, such as a coil, and a magnet assembly. The magnet assembly produces a magnetic field which interacts with a current flowing in the electrically conductive element to produce a Lorentz force between the electrically conductive element and the magnet assembly in a direction perpendicular to the direction of the current flow and the magnetic field at that point. Typically the magnet assembly includes at least one set of magnets on one or on either side of the electrically conductive element to produce an approximately uniform magnetic field around the electrical conductor. The magnet assembly includes a back iron for guiding a magnetic flux from one magnet to another. The back iron is formed from a material with high magnetic saturation and is located on the outward side of the magnets. The back iron is typically large to prevent saturation and it constitutes a substantial part of the mass of the actuator and is a source of loss of efficiency in the motor.

Currently known short stroke Lorentz actuators use the back iron not only to guide the magnetic flux from one magnet to the other, but also as a structural carrier. For this known back irons are constructed as substantially flat iron plates with magnets glued thereon.

However, iron as constructional carrier material is heavy and leads to heavy actuators, which leads to less acceleration and thus leads to a lower throughput. Furthermore, the dynamical performance and accuracy of the known actuators should be improved. Also the expansion of the iron when heated, because the motors heats up, is undesirable.

SUMMARY

It is desirable at least partly overcome the above-mentioned effects of conventional actuators, or to provide a usable alternative. More in particular it is desirable to provide a lithographic apparatus with a Lorentz actuator having a reduced mass but no loss of performance of the actuator.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an actuator constructed and arranged to produce a displacement force between a first and a second part of the apparatus to displace the first and second apparatus parts relative to each other, the actuator including at least a first magnet system subassembly, attached to one of the first and second part of the apparatus, configured to provide a magnetic field substantially perpendicular to the direction of the displacement force; and an electrically conductive element, attached to the other one of the first and second part of the apparatus and placed near the first magnet subassembly, configured to produce the displacement force by interaction of an electric current carried by the electrically conductive element and the magnetic field, the first magnet subassembly including at least one set of at least two adjacently placed magnets oriented such that their magnetic polarizations are substantially mutually opposite, and a back mass made out of a magnetic flux guiding material and connecting the magnets to guide a magnetic flux there between, wherein the first magnet subassembly furthermore includes a carrier made out of a non-magnetic-flux-guiding material, the carrier including at least one recess in which the at least one set of back mass and magnets is embedded.

In another embodiment of the invention, there is provided an actuator constructed and arranged to produce a displacement force between a first and a second part of an apparatus to displace the first and second apparatus parts relative to each other, the actuator including; at least a first magnet system subassembly, attached to one of the first and second part of the apparatus, configured to provide a magnetic field substantially perpendicular to the direction of the displacement force; and an electrically conductive element, attached to the other one of the first and second part of the apparatus and placed near the first magnet subassembly, configured to produce the displacement force by interaction of an electric current carried by the electrically conductive element and the magnetic field, the first magnet subassembly including at least one set of at least two adjacently placed magnets oriented such that their magnetic polarizations are substantially mutually opposite, and a back mass made out of a magnetic flux guiding material and connecting the magnets to guide a magnetic flux there between, wherein the first magnet subassembly furthermore includes a carrier made out of a non-magnetic-flux-guiding material, the carrier including at least one recess in which the at least one set of back mass and magnets is embedded.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
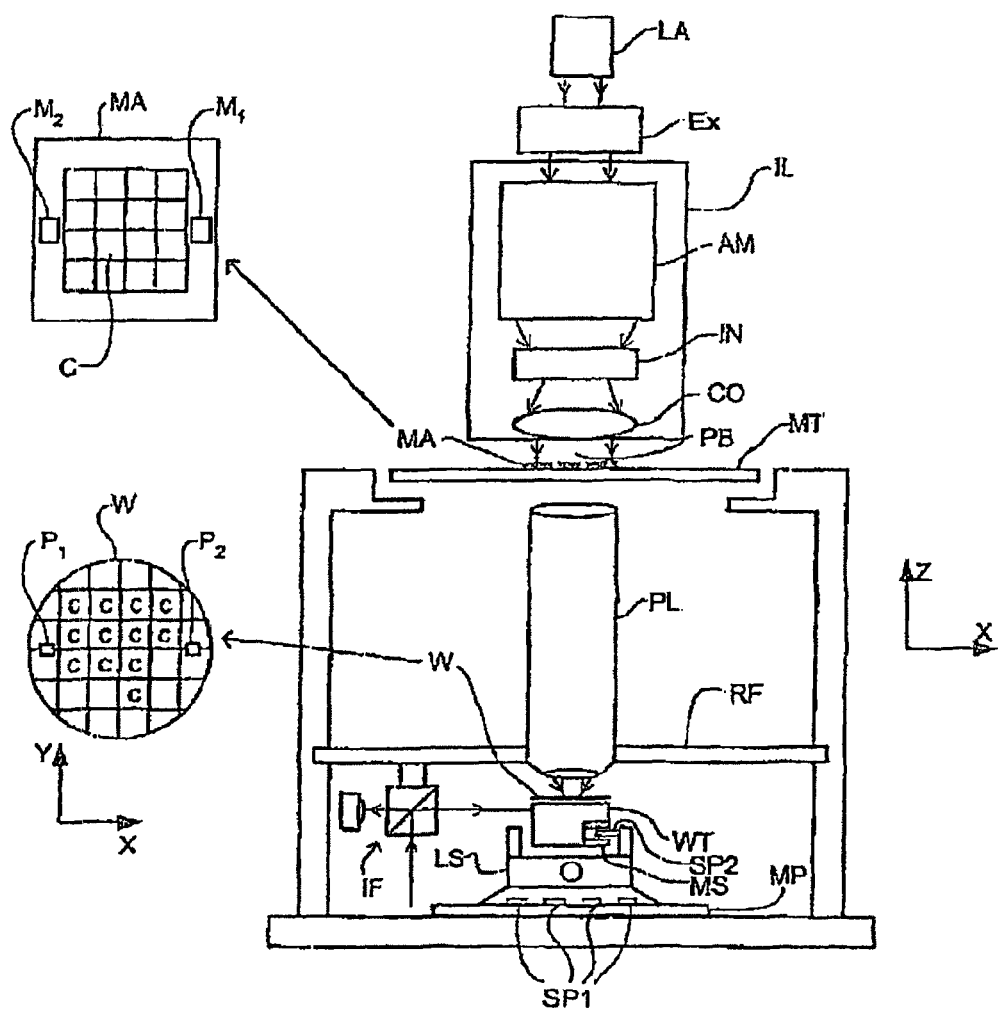
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or support or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W. The projection system PS is supported on a reference frame RF.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke drive module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed.

A long stroke drive module LS is moved by a planar motor, for example, as described in WO 01/18944. A magnet plate MP is fixed to a machine frame of the lithographic apparatus and the long stroke drive module LS is provided with a first set of coils SP1 that generate a force when a current is sent through the coils SP1. The force can levitate and move the long stroke drive module LS along the magnet plate MP. The substrate table WT is moved with respect to the long stroke module drive LS with the aid of Lorentz actuators including a second coil SP2 and a magnet MS. If a current is sent through the second coil SP2, a force may be generated between the long stroke drive module LS and magnet MS provided to the substrate table WT to finely position the substrate table WT. The substrate table WT can be moved up to six degrees of freedom (X, Y, Z, RZ, RY and RX) with respect to the long stroke drive module LS.

Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
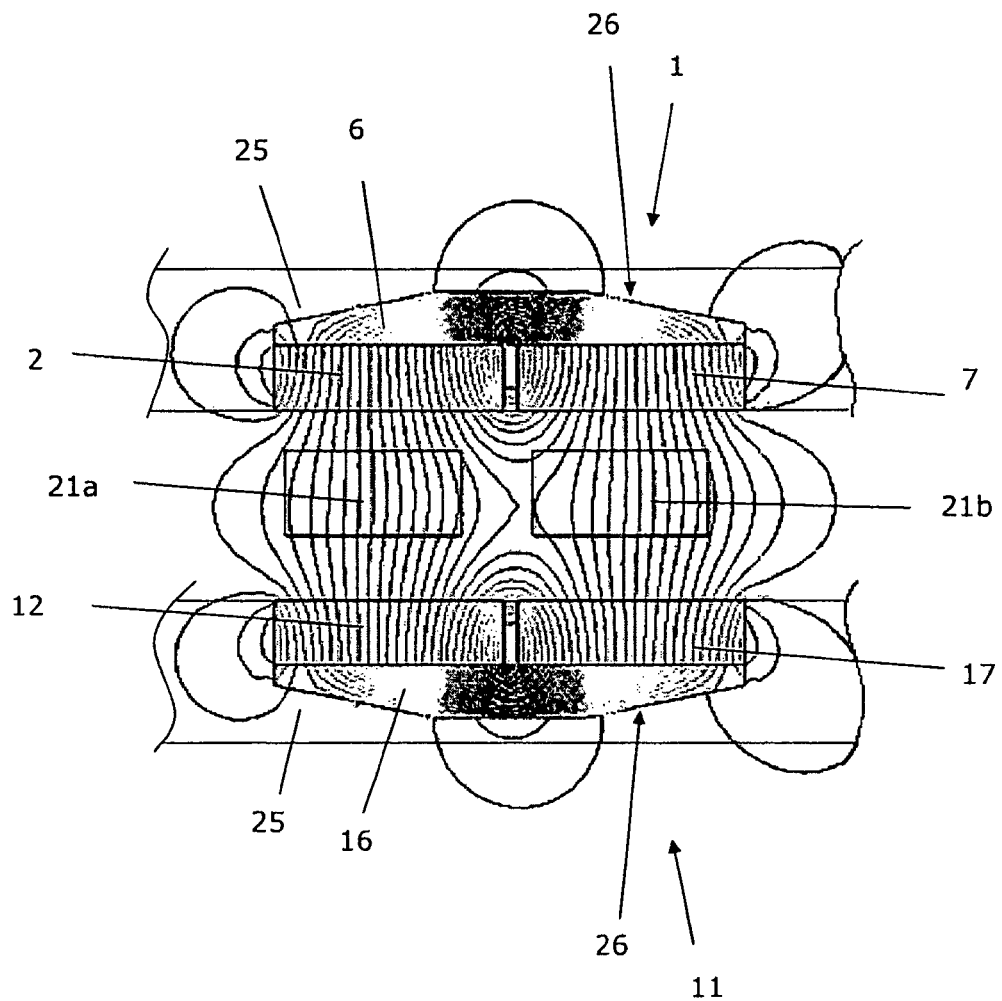
FIG. 2 shows in a schematic cross section the configuration of a Lorentz actuator according to an embodiment of the invention including the magnetic field lines calculated for this configuration.

FIG. 2 shows a cross section of the actuator according to an embodiment of the present invention. The same actuator is partially shown, in perspective, in FIG. 3. In use, the actuator generates a force in a first direction (or its opposite) which may be used to drive a short-stroke drive module for positioning the support structure (e.g. mask table) MT or the substrate table WT, or a lens element, or a wafer gripper. In FIG. 2, this first direction is a horizontal direction within the plane of the Figure. The actuator includes a first magnet subassembly 1, a second magnet subassembly 11 (MS in FIG. 1) and a coil 21 (SP2 in FIG. 1). The first and second magnet subassemblies 1, 11 define a space between them in a second direction, perpendicular to the first direction. The coil 21 is located in this space.

The combination of the first and second magnet subassemblies 1, 11 forms a magnet assembly that is mounted on the substrate table WT or the support structure (e.g. mask table) MT to be driven by the actuator. The coil 21 is mounted on the long-stroke module (not shown) or, in the case of a support structure (e.g. mask table) MT of a wafer stepper apparatus that does not have a long-stroke module (as described above), on a fixed portion (or frame or base) of the apparatus.

Although the magnet assembly may alternatively be mounted on the long-stroke module and the coil on the substrate table or the mask table, the present configuration is preferred since it facilitates the provision of power and cooling to the coil.

The first magnet subassembly 1 is composed of a first magnet 2 and a second magnet 7. The second magnet subassembly 11 correspondingly has a first magnet 12 and a second magnet 17. In a preferred arrangement, the magnets are permanent magnets.

Each of the magnet subassemblies 1, 11 has a back mass 6, 16, respectively. In each subassembly 1 11 the back mass 6, 16 is located on the other side of the magnets to the space that is defined between the magnet subassemblies 1, 11. The back mass 6, 16 adjoins each of the magnets 2, 7 and 12, 17 respectively in its subassembly 1, 11 and preferably entirely covers the surfaces of the magnets 2, 7 and 12, 17 respectively. The back mass 6, 16 preferably tapers, at least partly, in the direction away from the space between the magnet subassemblies 1, 11. The back mass 6, 16 is preferably formed from CoFe, but may also be made out of any other magnetic material.

The coil 21 (SP2 in FIG. 1), having two sides 21a and 21b (as shown in FIG. 2), is located between the magnet subassemblies 1, 11 (MS in FIG. 1) and is included of orthocyclic windings. Other kind of coils are also possible, like for example foil coils. The coil 21 is arranged such that, where it is located between the first and second magnet subassemblies 1, 11, the wires that it is composed from are perpendicular to both the first and second directions defined above. As shown in FIG. 2a, the wires are oriented in a direction perpendicular to the plane of the Figure.

The magnets in the first and second magnet subassemblies 1, 11 are oriented such that the magnetic polarizations of the first magnet 2 in the first magnet subassembly 1 is parallel to the magnetic polarization of the first magnet 12 of the second magnet subassembly 11 and in a direction perpendicular to the first direction, defined above, namely perpendicular to the direction of the force generated by the actuator. The second magnets 7, 17 are preferably oriented such that their magnetic polarizations are parallel to one another and anti-parallel to the magnetic polarizations of the first magnets 2, 12. It is also possible to use magnet configurations which are magnetized under a small angle. Furthermore it is an option to use Hallbach magnets to intensify the magnetic field.

The resulting magnetic field that this configuration produces, as shown in FIG. 2, includes regions of approximately uniform magnetic field between the two pairs of magnets. The two sides of the coil 21a, 21b are located in these regions. When an electric current is passed through the coil 21, the current flow through the two sides of the coil 21 is in opposite directions. Therefore, since the directions of magnetic field in the two regions in which the two sides of the coil 21a, 21b are located are also opposite, the force exerted on the two sides of the coil 21 is in the same direction (perpendicular to both the magnetic field and the current flow).

In FIG. 2, each magnet subassembly furthermore includes a carrier 25 which is made out of a material not guiding magnetic flux. With this, the set of back mass 6 and magnets 2, 7 is embedded in a recess 26 in the carrier 25. The carrier 25 extends both at the backside of the back mass 6, but also extends along side wall parts of the back mass 6 and magnets 2, 7 up till the level of the front faces of the magnets 2, 7. Because of the magnets 2, 7 being embedded in the carrier 25, and because the carrier 25 is made out of non-magnetic-flux-guiding material, it is possible to use the available space around the magnets 2, 7 as carrier structure. The stiffness of the magnets 2, 7, and back mass 6 contributes to the stiffness of the carrier structure. This design leads to a higher natural frequency of the actuator. The subassembly of carrier 25, with embedded back mass 6 and magnets 2, 7, forms a stiff construction. The stiff construction makes it possible to make the carrier 25 out of a light weight material. This saves weight particularly with respect to the state of the art embodiment wherein the back mass also needed to perform the carrier function and thus needed to be constructed rather large. According to an embodiment of the present invention, the back mass 6 only needs to cover the magnets 2, 7, and thus can be made rather slender. Again this saves weight, which leads to higher possible accelerations and thus leads to higher possible throughputs. Furthermore, the dynamical performance and accuracy is considerably improved.

Preferably, the carrier is made out of a fiber reinforced plastic material, in particular a carbon fiber reinforced epoxy material or ceramics like silicon carbide (SiC) or aluminum oxide ($Al_2O_3$). This provides for a high stiffness combined with reasonable costs. The fibers make it possible to optimize the stiffness in desired directions by positioning them unidirectional in plastic material in a specific direction. In an embodiment, the carrier is made out of a material having a density lower than that of the back mass material. Furthermore it is possible to manufacture the carrier out of a material having a low coefficient of thermal expansion. This leads to less deformations due to thermal loads of the actuator, which otherwise would have resulted in overlay loss.

Since the back masses now are only there to guide the magnetic flux from one magnet to another adjacent magnet, and do not have to perform a carrier function, it is possible to use a material which is excellent for guiding the magnetic flux, for example cobalt iron. This guides a magnetic flux up till 20% better than normal iron. This in turn makes it possible to make the back mass even more slender and to save upon the back mass material, leading to lighter actuators, leading to higher throughput. For example, a more than 30 percent lighter actuator light may be achieved having almost 30 percent higher natural frequency. The fact that cobalt iron is harder to shape is no longer a problem since the back mass only needs to cover its magnets, and does not have to take the difficult shape of a carrier.

Each set of back mass and magnets is glued into its corresponding recess in the carrier in an embodiment of the invention. This provides for a simple and solid connection. Furthermore the glue is able to fill up the entire space between the recess walls and the set of back mass and magnets, thus making the entire magnet subassembly stiffer.

Figure 3:
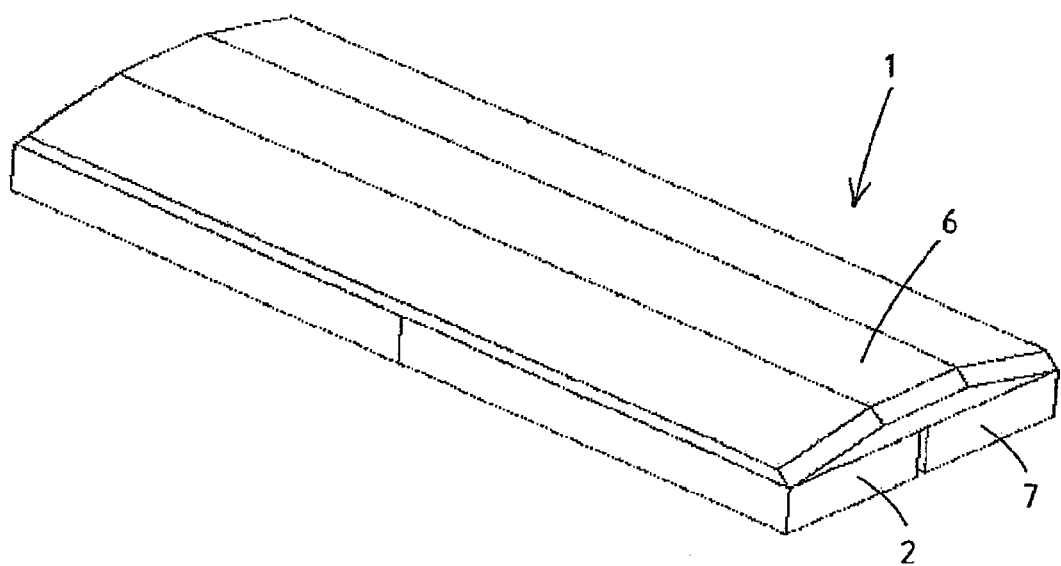
FIG. 3 shows in perspective the above positioned set of back mass and magnets of FIG. 2.
Figure 4:
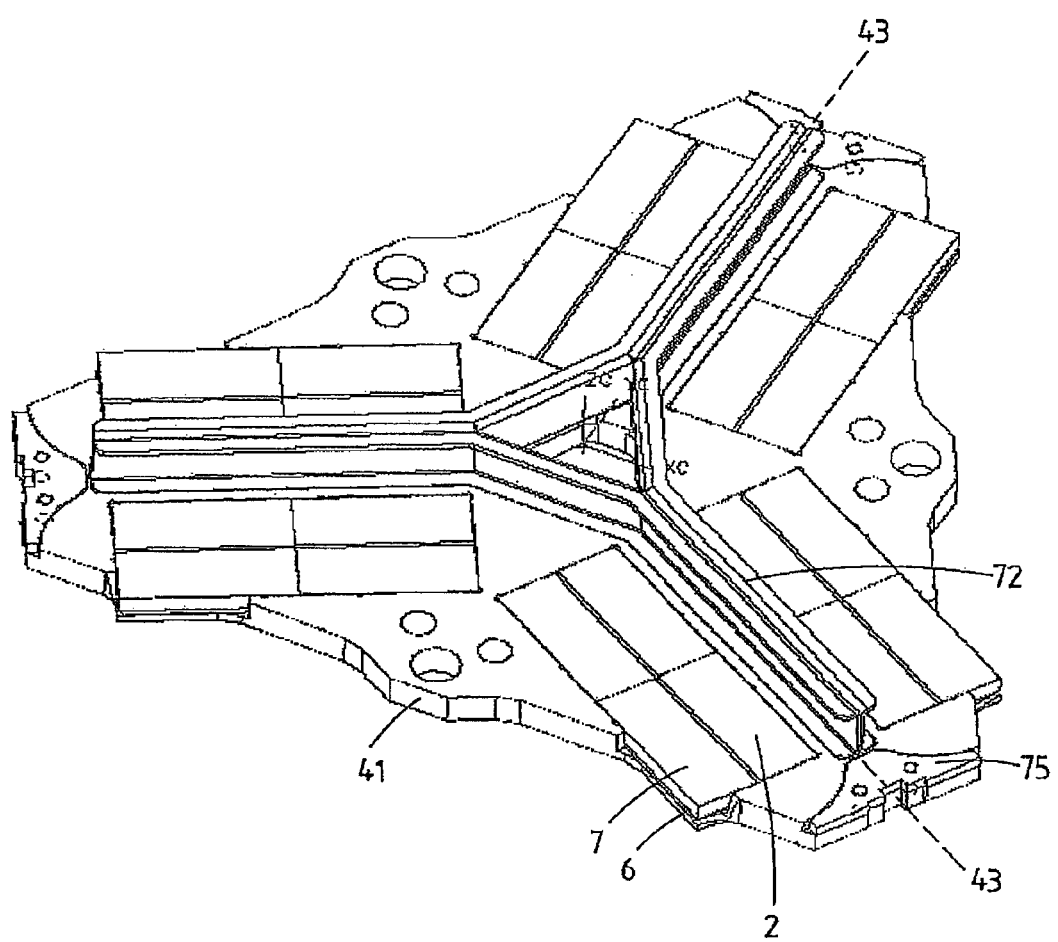
FIG. 4 shows a magnet system subassembly with a composite carrier carrying several of the sets of FIG. 3 in accordance with an embodiment of the invention.
Figure 5:
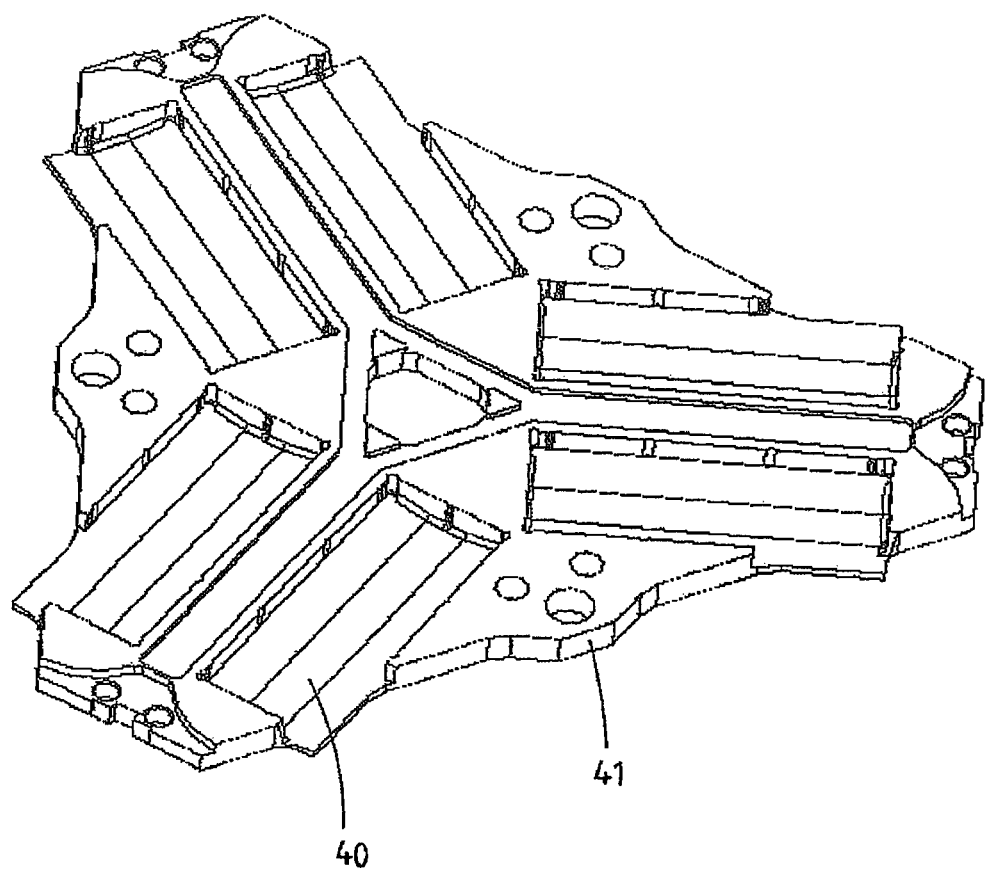
FIG. 5 shows the carrier of FIG. 4.

An embodiment of the present invention is particularly beneficial where several of the sets of back mass and magnets connected thereto are positioned adjacent and or close to one another. It will be appreciate that these sets are not short circuited with each other, because of the carrier being made out of the non-flux-guiding-material. An example thereof is shown in FIGS. 4-10. In these figures an embodiment of a magnet subassembly is shown wherein three double sets of a back mass 6 and magnets 2, 7 as shown in FIG. 3 are embedded into respective recesses 40 in a composite plate shaped carrier 41. With this, each of the double sets 1 is being placed along a respective bisector 43 of an isocele triangle. The carrier 41 again is made out of a non-magnetic-flux-guiding material. The recesses 40 are shaped complementary to the shape of the set of back mass and magnets, in particular such that the carrier wall parts delimiting the recesses 40 cover the larger part of the side faces of the magnets 2, 7 over their entire height up till the level of the front face of the magnets. The recesses 40 furthermore are such that the carrier material also covers the backsides of the sets of back mass and magnets.

Here, also the composite carrier together with the embedded packages of back mass and magnets therein, beneficially forms a solid and stiff structure constructed and arranged to hold the separate packages of magnets and back masses. The use of this type of carrier leads to a structure with a higher natural frequency which is directly related to the accuracy of the wafer stage, mass table or other part of the apparatus to be positioned. This leads to a better overlay performance of the apparatus during a manufacturing process.

Figure 6:
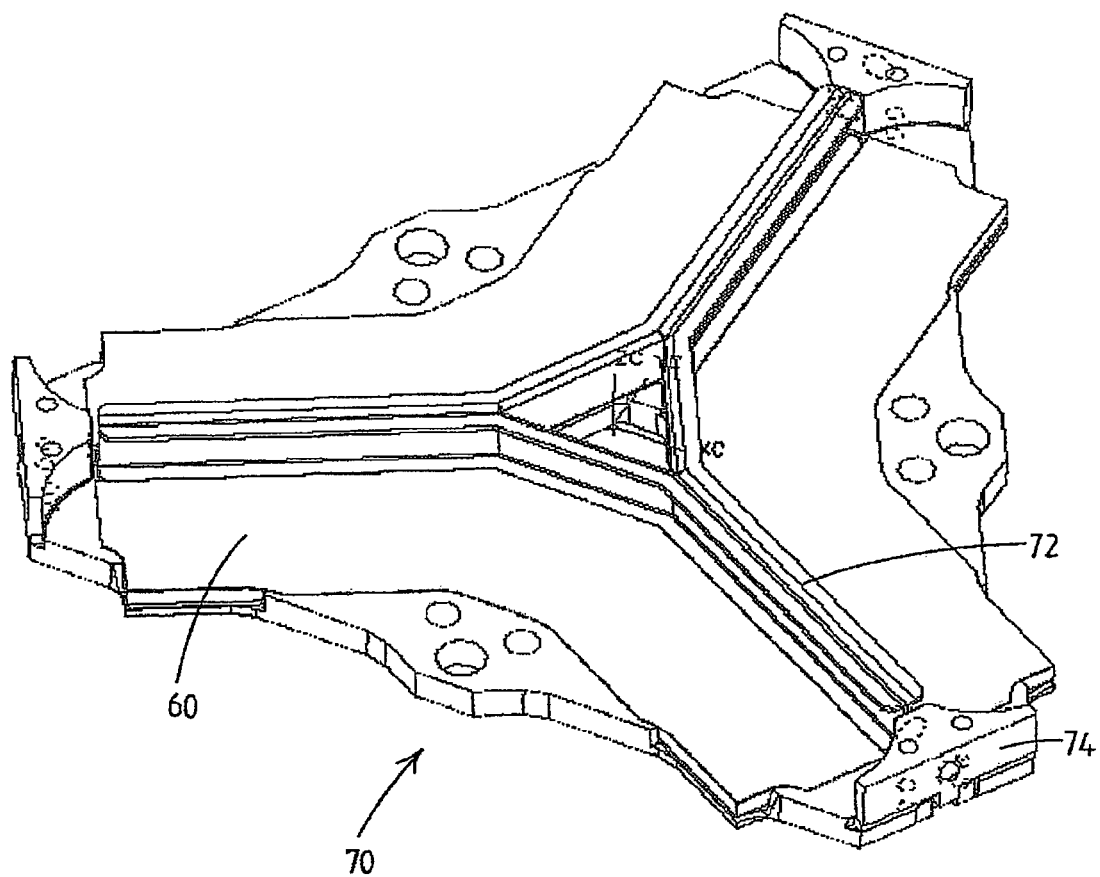
FIG. 6 shows the magnet system subassembly of FIG. 4 with added sub-carrier in accordance with an embodiment of the invention.

FIG. 6 shows that the subassembly also includes plate shaped sub-carriers 60 which cover a large part of the front side of the carrier 41 with the embedded sets of back mass 6 and magnets 2, 7 therein. The sub-carriers are also made out of a non-magnetic-flux-guiding material, preferably the same material as the material the carrier is made from, that is to say a fiber reinforced plastic material, more in particular a carbon fiber reinforced epoxy material. The sub-carriers 60 have the benefit of adding stiffness to the subassembly.

The fibers of the carrier and/or the sub-carriers may be oriented quasi isotropic or unidirectional, for example along the respective bisector 43 of the triangular shaped subassembly or perpendicular to these bisectors.

Figure 7:
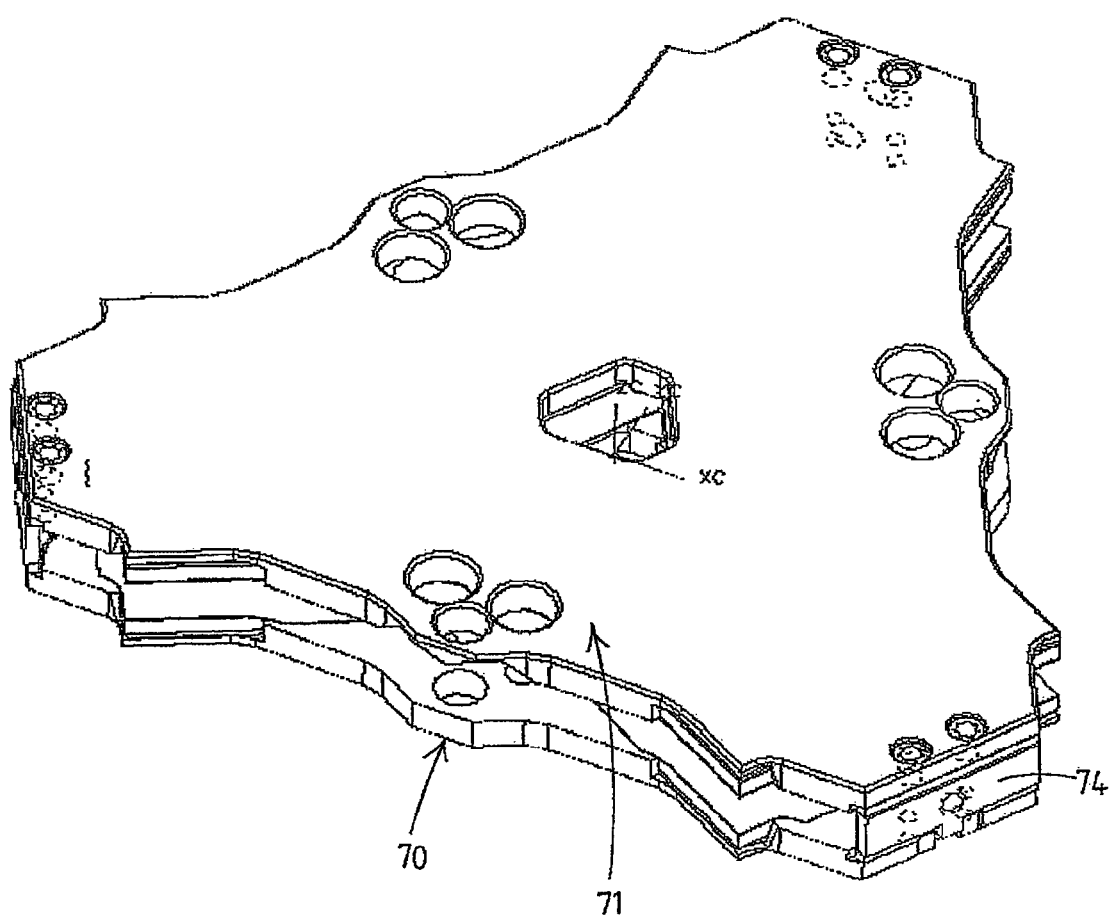
FIG. 7 shows two magnet system subassemblies of FIG. 6 placed opposite one another in accordance with an embodiment of the invention.
Figure 8:
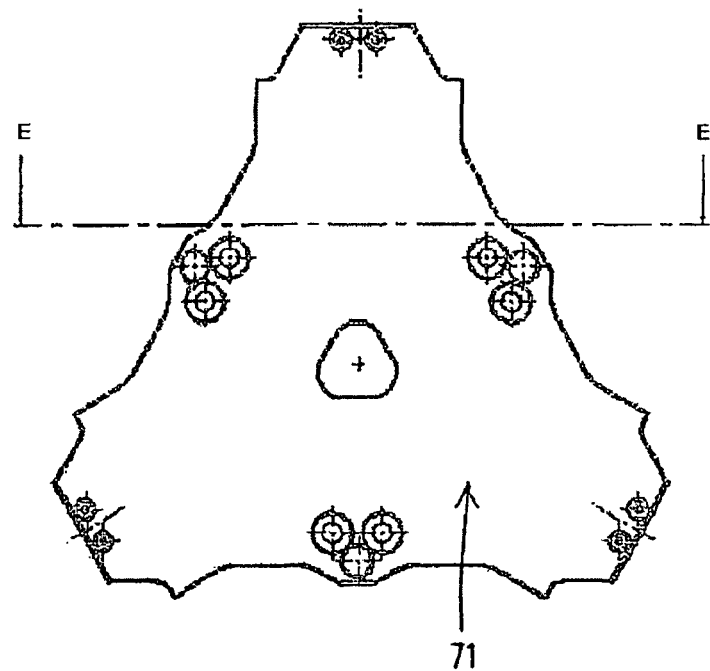
FIG. 8 shows a top view of the magnet assembly of FIG. 7.
Figure 9:
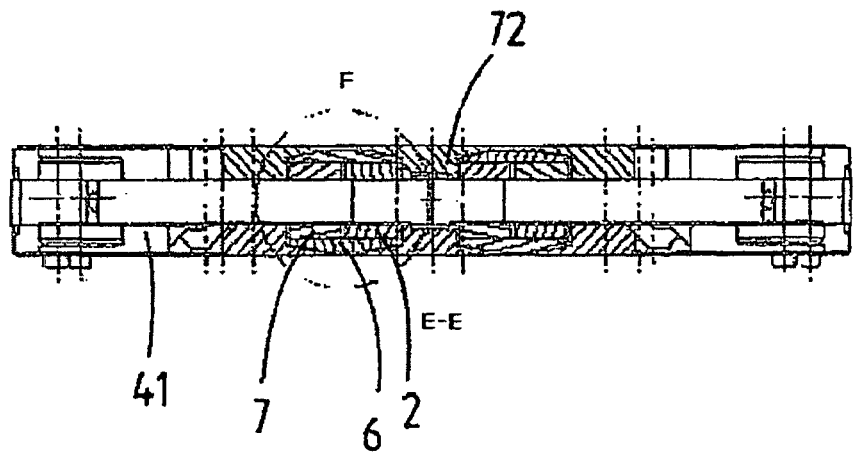
FIG. 9 shows a cross section along the line E-E in FIG. 8 in accordance with an embodiment of the invention.
Figure 10:
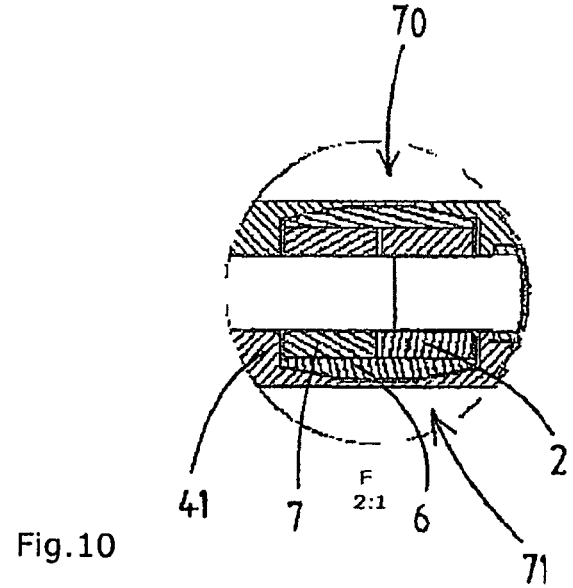
FIG. 10 shows an enlarged view of the detail F in FIG. 9.

FIG. 7 shows the complete assembly of a first and second magnet subassembly 70, 71 corresponding to the one shown in FIG. 6. In between the two subassemblies a central star shaped distance holder 72 is provided (see FIG. 4). Furthermore on the corners of the triangular shaped subassemblies 70, 71 connection blocks 74 are provided which together with interfaces 75 in the respective carriers are able to connect the subassemblies with each other without having to provide threads in the carriers.

Figure 11:
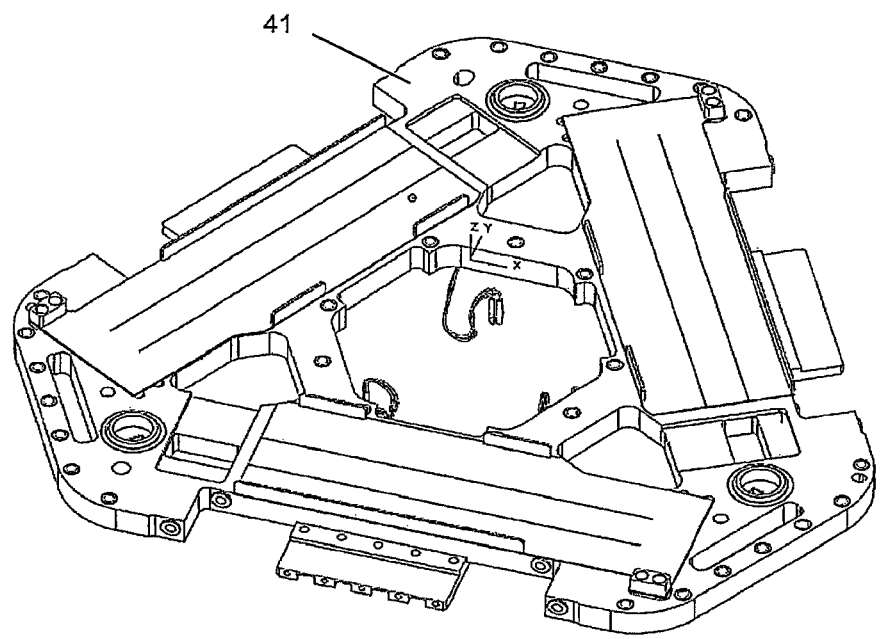
FIG. 11 shows a magnet system subassembly with a composite carrier carrying several of the sets of FIG. 3 according to another embodiment of the invention.
Figure 12:
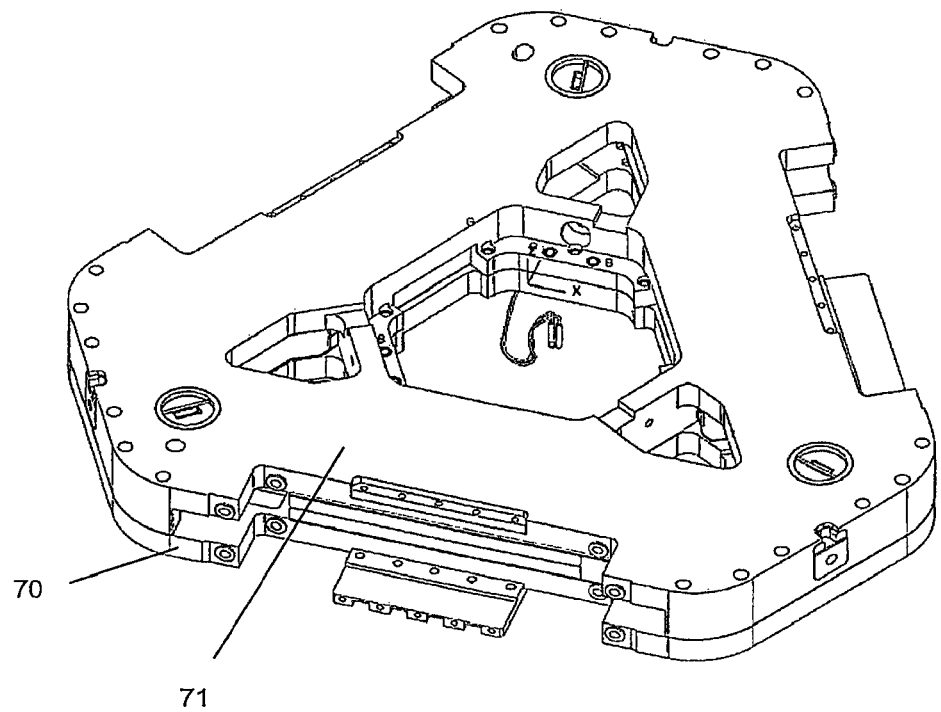
FIG. 12 shows two magnet system subassemblies placed opposite to one another in accordance with another embodiment of the invention.

FIGS. 11-12 show a magnet subassembly in accordance with an embodiment of the invention. In these figures an embodiment of a magnet subassembly is shown wherein three double sets of a back mass and magnets as shown in FIG. 3 are embedded into respective recesses 40 in a composite plate shaped carrier 41. With this, each of the double sets 1 is being placed along each side of a triangle. The carrier 41 again is made out of a non-magnetic-flux-guiding material. FIG. 12 shows the complete assembly of the first and the second magnet subassembly 70, 71.

Besides the embodiments shown, many variants are possible. For example the several parts of the actuator may have different shapes. The recesses in the carrier may embed a larger or smaller part of the back masses and/or magnets. It is also possible for the sets of back masses and magnets to be connected with the carrier in another way, for example by means of a form connection. The carrier may also be made out of another non-magnetic-flux-guiding material, for example ceramic material like SiC or $Al_2O_3$ or carbon fiber reinforced epoxy material with metal stiffeners. The fibers of the fiber reinforced variant may also be made out of another material, for example glass fibers, Kevlar fibers, high strength fibers or high modulus fibers.

Besides being used in a lithographic apparatus, the actuator according to an embodiment of the invention may also be used for other purposes, like for example pick and place applications, wire-bonding, E-beam applications, electron microscopes, etc. Furthermore the actuator may also be used in a linear drive type Lorentz actuator, and in single sided actuators, wherein two opposed magnets (north and south) are placed adjacent one another on a back mass embedded in a carrier according to the invention, and wherein the magnetic flux bends from the one magnet towards the other.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. An actuator constructed and arranged to produce a displacement force between a first and a second part to displace the first and second parts relative to each other, the actuator comprising:

a first magnet subassembly, attached to one of the first and second parts, and configured to provide a magnetic field substantially perpendicular to the direction of the displacement force, the first magnet subassembly comprising at least one set of at least two magnets that are oriented such that their magnetic polarizations are substantially mutually opposite;

a back mass made of a magnetic flux guiding material and connecting the magnets to guide a magnetic flux there between, the back mass being arranged adjacent to the at least two magnets;

an electrically conductive element, attached to the other one of the first and second parts and placed near the first magnet subassembly, and configured to produce the displacement force by interaction of an electric current carried by the electrically conductive element and the magnetic field, and a carrier made of a non-magnetic-flux-guiding material, the carrier being configured to carry at least three sets of back mass and magnets, each set extending along a longitudinal direction, wherein the longitudinal direction of any of the at least three sets intersects the longitudinal direction of each of the remaining sets, wherein the carrier comprises a plurality of recesses in which the at least three sets of back mass and magnets are embedded so that said carrier covers a backside of said back mass and at least a portion of a side wall of each of said magnets without entirely covering a side of each of said magnets that faces, in use, said electrically conductive element.

2. The actuator of claim 1, wherein each set of back mass and magnets is placed substantially along a side of a polygon.

3. The actuator of claim 2, wherein the polygon is a triangle.

4. The actuator of claim 1, wherein each set of back mass and magnets is placed substantially along a respective bisector of an isosceles triangle.

5. The actuator of claim 1, wherein the at least two magnets substantially abut each other.

6. The actuator of claim 1, wherein a space that separates the at least two magnets is substantially devoid of magnetic material.

7. The actuator of claim 1, wherein the side wall of each of said magnets is covered by said carrier over substantially its entire height.

8. The actuator of claim 1, wherein the carrier includes an opening extending there through, said at least three sets of back mass and magnets arranged around the opening.

9. The actuator of claim 1, wherein the back mass is dimensioned to cover substantially entirely a backside of each of the at least two magnets.

10. A lithographic apparatus comprising:

a projection system configured to project a patterned radiation beam onto a target portion of a substrate; and an actuator constructed and arranged to produce a displacement force between a first and a second part to displace the first and second parts relative to each other, the actuator comprising:

a first magnet subassembly, attached to one of the first and second parts, and configured to provide a magnetic field substantially perpendicular to the direction of the displacement force, the first magnet subassembly comprising at least one set of at least two magnets that are oriented such that their magnetic polarizations are substantially mutually opposite;

a back mass made of a magnetic flux guiding material and connecting the magnets to guide a magnetic flux there between, the back mass being arranged adjacent to the at least two magnets;

an electrically conductive element, attached to the other one of the first and second parts and placed near the first magnet subassembly, and configured to produce the displacement force by interaction of an electric current carried by the electrically conductive element and the magnetic field, and a carrier made of a non-magnetic-flux-guiding material, the carrier being configured to carry at least three sets of back mass and magnets, each set extending along a longitudinal direction, wherein the longitudinal direction of any of the at least three sets intersects the longitudinal direction of each of the remaining sets, wherein the carrier comprises a plurality of recesses in which the at least three sets of back mass and magnets are embedded so that said carrier covers a backside of said back mass and at least a portion of a side wall of each of said magnets without entirely covering a side of each of said magnets that faces, in use, said electrically conductive element.

11. The lithographic apparatus of claim 10, wherein each set of back mass and magnets is placed substantially along a side of a polygon.

12. The lithographic apparatus of claim 11, wherein the polygon is a triangle.

13. The lithographic apparatus of claim 10, wherein each set of back mass and magnets is placed substantially along a respective bisector of an isosceles triangle.

14. The lithographic apparatus of claim 10, wherein the at least two magnets substantially abut each other.

15. The lithographic apparatus of claim 10, wherein a space that separates the at least two magnets is substantially devoid of magnetic material.

16. The lithographic apparatus of claim 10, wherein the side wall of each of said magnets is covered by said carrier over substantially its entire height.

17. The lithographic apparatus of claim 10, wherein the carrier includes an opening extending there through, said at least three sets of back mass and magnets arranged around the opening.

18. The lithographic apparatus of claim 10, wherein the back mass is dimensioned to cover substantially entirely a backside of each of the at least two magnets.

* * * * *